(12) United States Patent
Goebel et al.

(10) Patent No.: US 7,858,448 B2
(45) Date of Patent: Dec. 28, 2010

(54) METHOD OF FORMING SUPPORT STRUCTURES FOR SEMICONDUCTOR DEVICES

(75) Inventors: Thomas Goebel, Fishkill, NY (US); Erdem Kaltalioglu, Newburgh, NY (US); Sun-Oo Kim, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/572,905

(22) Filed: Oct. 2, 2009

(65) Prior Publication Data

US 2010/0022085 A1    Jan. 28, 2010

Related U.S. Application Data

(62) Division of application No. 11/248,554, filed on Oct. 12, 2005, now Pat. No. 7,626,268.

(51) Int. Cl.
*H01L 21/82*    (2006.01)

(52) U.S. Cl. .................. 438/129; 438/612; 257/779; 257/E21.579

(58) Field of Classification Search .................. 438/129
See application file for complete search history.

(56) References Cited

U.S. PATENT DOCUMENTS

| | | | | |
|---|---|---|---|---|
| 5,739,587 A | | 4/1998 | Sato | |
| 5,767,575 A | * | 6/1998 | Lan et al. | 257/701 |
| 5,858,815 A | * | 1/1999 | Heo et al. | 438/112 |
| 5,952,843 A | * | 9/1999 | Vinh | 324/761 |
| 5,986,343 A | | 11/1999 | Chittipeddi et al. | |
| 6,258,715 B1 | | 7/2001 | Yu et al. | |
| 6,313,024 B1 | * | 11/2001 | Cave et al. | 438/598 |
| 6,428,641 B1 | * | 8/2002 | Yoon et al. | 156/64 |
| 6,444,295 B1 | | 9/2002 | Peng et al. | |
| 7,109,068 B2 | * | 9/2006 | Akram et al. | 438/128 |
| 7,524,731 B2 | * | 4/2009 | Wang | 438/381 |
| 2002/0043727 A1 | * | 4/2002 | Wu | 257/786 |
| 2005/0073058 A1 | * | 4/2005 | Kuo et al. | 257/786 |
| 2006/0157849 A1 | | 7/2006 | Goller et al. | |
| 2008/0020488 A1 | * | 1/2008 | Clevenger et al. | 438/3 |
| 2008/0079159 A1 | * | 4/2008 | Gupta et al. | 257/758 |

* cited by examiner

*Primary Examiner*—Jarrett J Stark
*Assistant Examiner*—Nicholas Tobergte
(74) *Attorney, Agent, or Firm*—Slater & Matsil, L.L.P.

(57) ABSTRACT

Support structures for semiconductor devices and methods of manufacturing thereof are disclosed. In some embodiments, the support structures include a plurality of support members that is formed in a substantially annular shape beneath a wire bond region. The central region inside the substantially annular shape of the plurality of support members may be used to route functional conductive lines for making electrical contact to active areas of the semiconductor device. Dummy support structures may optionally be formed between the functional conductive lines. The support structures may be formed in one or more conductive line layers and semiconductive material layers of a semiconductor device. In other embodiments, support members are not formed in an annular shape, and are formed in insulating layers that do not comprise low dielectric constant (k) materials.

20 Claims, 6 Drawing Sheets

METHOD OF FORMING SUPPORT STRUCTURES FOR SEMICONDUCTOR DEVICES

This is a divisional application of U.S. application Ser. No. 11/248,554, entitled, Support Structures for Semiconductor Devices, which was filed on Oct. 12, 2005 now U.S. Pat. No. 7,626,268 and is incorporated herein by reference.

TECHNICAL FIELD

The present invention relates generally to the fabrication of semiconductor devices, and more particularly to the formation of support structures for wire bonding areas of semiconductor devices.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices typically include several layers of insulating, conductive and semiconductive materials that are patterned to form integrated circuits. There may be a plurality of transistors, memory devices, switches, conductive lines, diodes, capacitors, logic circuits, and other electronic components formed on a single die or chip. Semiconductor technology has seen a trend towards miniaturization, to meet the demands of product size reduction, improved device performance, and reduced power requirements in the end applications that semiconductors are used in, for example.

The manufacturing process for semiconductor devices is typically referred to in two phases: the front-end-of-line (FEOL) and the back-end-of-line (BEOL). The FEOL is typically defined as the processing steps that begin with a starting semiconductor wafer or workpiece up to the formation of the first metallization layer, and the BEOL is defined as the processing steps from that point forward, for example.

In the past, integrated circuits contained a relatively small number of devices per chip or die, and the devices could be easily interconnected. However, in more recent integrated circuit designs, there may be hundreds or thousands of devices on a single chip, resulting in the need for multilevel interconnect systems, wherein the area for interconnect lines is shared among two or more material levels.

As the minimum line width on integrated circuits becomes smaller, the active device density increases, and the time required for transistors to charge capacitive loads becomes limiting on the performance of the integrated circuit. Also, as the chip size increases, the interconnect path lengths also increase. Thus, many large ultra-large scale integration (ULSI) circuits are limited by interconnect propagation delay time. The propagation delay of integrated circuits becomes limited by the RC delay of the interconnection lines when the minimum feature size decreases below about 1 μm, for example, which limits the circuit speeds. The RC delay refers to the resistance (R) of the conductive lines used for the interconnect lines and the capacitance (C) between the conductive lines.

One challenge in the semiconductor industry is to reduce and minimize the RC delay of integrated circuits, in order to improve device performance and increase device speed. The resistive or R component of RC delay is being addressed by a move from the use of aluminum to copper, which has a lower resistance than aluminum, as the material for conductive lines. The C or capacitive component of RC delay is being addressed by the use of insulating materials between the conductive lines that comprise a lower dielectric constant (k) than materials such as $SiO_2$ that were used in the past for inter-metal dielectric (IMD). However, most low k insulating materials are structurally weak.

Another challenge in fabricating semiconductor devices is that electrical contact must be made from the very small chip or integrated circuit to leads of a package, or to other chips, in a multi-chip module, for example. The electrical contact to an integrated circuit is made using wire bonds that are wire bonded to bond pads on the chips. The wire bonding process involves placing a wire, typically comprising gold or other metal, against a bond pad on the integrated circuit, and applying pressure to the wire while vibrating the wire, causing the wire to become bonded to the bond pad. Destructive wire bond strength tests (e.g., the test chips are discarded after the tests) are typically performed on a small number of semiconductor devices in a lot after the wire bonding process, in which an upward force is applied to a wire to determine how much force it takes to lift the wire from the bond pad.

If the material layers beneath the bond pad are weak, the semiconductor device may be damaged during the wire bonding process. Furthermore, when tests on the wire bonds are performed, damage and lift-off of the bond pads can occur. For example, portions of the material layers beneath and adjacent the bond pad may be pulled away or lifted during the wire bond strength tests. The introduction of low k materials as insulating materials in semiconductor device manufacturing has made pad stacks for wire bonding more critical because of the weaker material properties of the low k materials.

Therefore, some recent semiconductor designs have support structures formed in the metallization layers beneath the bond pads in the low k insulating material layers. However, some of these prior art support structures take up valuable real estate on chips. For example, the presence of support structures in the bond pad region prohibits or limits the use of the area under the bond pads from being used as functional conductive lines, e.g., for the electrical wiring of the semiconductor device, in the low k insulating material layers.

Furthermore, prior art support structures are formed only in conductive line and via layers having a low k material, e.g., comprising a dielectric constant of less than the dielectric constant of $SiO_2$, or having a k value of less than about 3.9. Forming support structures in only the low k material layers causes stress fractures, delamination of the low k material due to sheer force stress, and an increased risk of tear-outs during wire bond tests, for example.

Thus, what are needed in the art are improved support structures for providing mechanical support for wire bond areas of semiconductor devices, particularly in semiconductor devices having low k insulating materials as dielectric layers.

SUMMARY OF THE INVENTION

These and other problems are generally solved or circumvented, and technical advantages are generally achieved, by preferred embodiments of the present invention, which provide novel support structures and methods of forming thereof, disposed beneath bond pads of semiconductor devices. In some embodiments, the support structures comprise support members that are primarily formed in regions where the support is needed the most, e.g., in the regions proximate the perimeter of a wire bond that is bonded to the bond pad.

Functional conductive lines may then be formed in the central region beneath the bond pad and between the support members. In other embodiments, support structures are formed not only in the low k insulating material layers, but also in the other, non-low k insulating material layers, anchoring the support structures to the workpiece or substrate, or to the upper material layers of the semiconductor device.

In accordance with a preferred embodiment of the present invention, a semiconductor device includes a workpiece, at least one first material layer disposed over the workpiece, and a second material layer disposed over the at least one first material layer. The second material layer includes at least one bond pad. A support structure is disposed in the at least one first material layer beneath the at least one bond pad. The support structure comprises a plurality of support members, wherein the plurality of support members of the support structure comprises a first substantially annular shape beneath the at least one wire bond pad.

In accordance with another preferred embodiment of the present invention, a semiconductor device includes a workpiece, at least one first material layer disposed over the workpiece, and a second material layer disposed over the at least one first material layer. The second material layer includes at least one bond pad, and a wire bond is coupled to the at least one bond pad. The wire bond comprises maximum stress regions adjacent the at least one bond pad. A support structure is disposed in the at least one first material layer proximate the maximum stress regions of the wire bond.

In accordance with another preferred embodiment of the present invention, a method of manufacturing a semiconductor device includes providing a workpiece, forming at least one first material layer over the workpiece, and forming a second material layer over the at least one first material layer, the second material layer including at least one bond pad. Forming the at least one first material layer includes forming a support structure in the at least one first material layer beneath the at least one bond pad, the support structure comprising a plurality of support members, wherein the plurality of support members comprises a first substantially annular shape beneath the at least one wire bond pad.

In accordance with yet another preferred embodiment of the present invention, a method of designing a semiconductor device includes designing a semiconductor device active region, determining a layout for a plurality of bond pads to be disposed over the semiconductor device active region, determining a first diameter for a perimeter of a wire bond that will be bonded to each of the plurality of bond pads, and designing a layout for at least one conductive line layer for the semiconductor device to be disposed between the active region and the plurality of bond pads. The layout for the at least one conductive line layer includes a plurality of support members arranged in a substantially annular shape proximate a perimeter of the wire bond to be bonded to each bond pad. The annular shape of the plurality of support members comprises a second diameter, wherein the second diameter is substantially equal to the first diameter.

In accordance with another preferred embodiment of the present invention, a semiconductor device includes a workpiece and a first low k insulating material layer disposed over the workpiece. The first low k insulating material layer comprises a first dielectric constant, and a plurality of first support vias are formed in the first low k insulating material layer. A second low k insulating material layer comprising the first dielectric constant is disposed over the first low k insulating material layer. A plurality of first support members is formed in the second low k insulating material layer, wherein the plurality of first support vias makes contact with the plurality of first support members. At least one bond pad region is disposed over the second low k insulating material layer, wherein the plurality of first support vias and the plurality of first support members provide mechanical support for the at least one bond pad region. At least one first insulating material layer comprising a second dielectric constant is disposed either between the workpiece and the first low k insulating material layer or between the second low k insulating material layer and the at least one bond pad region, or both. The second dielectric constant is greater than the first dielectric constant, and a plurality of second support members are formed in the at least one first insulating material layer.

Advantages of preferred embodiments of the present invention include providing structural supports for wire bond regions while allowing the formation of functional conductive lines under bond pads of a semiconductor device, saving space. Smaller semiconductor devices can be manufactured, e.g., current designs may be scaled down in size, in accordance with embodiments of the present invention. Semiconductor devices with more stable mechanical structures beneath bond pads are provided.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
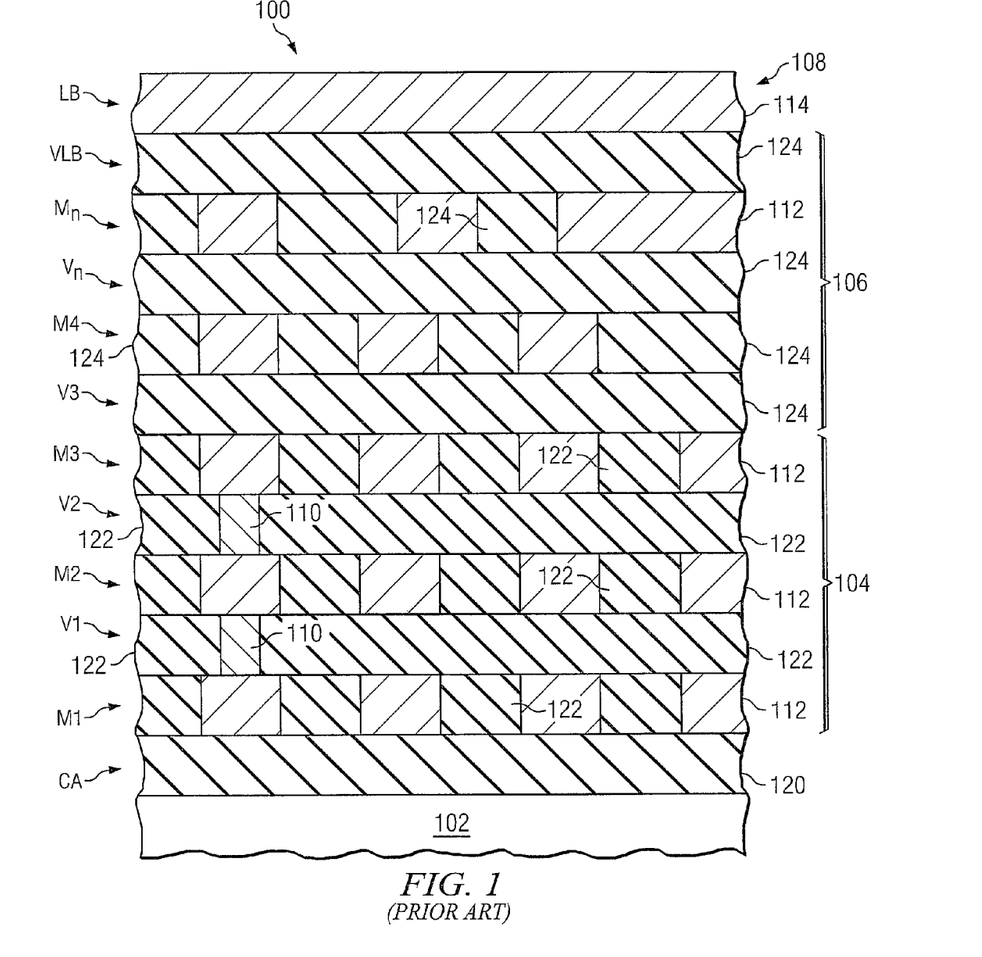
FIG. 1 shows a cross-sectional view of a prior art semiconductor device having a multi-level interconnect structure disposed beneath a bond pad.

FIG. 1 shows a cross-sectional view of a prior art semiconductor device 100 having a multi-level interconnect structure disposed beneath a bond pad 114. The semiconductor device 100 includes a workpiece 102 that may comprise a semiconductor substrate having active components such as transistors and other devices formed thereon. A plurality of insulating layers 120, 122, and 124 with vias and conductive lines 112 formed therein is disposed over the workpiece 102. A bond pad 114 is formed in a top-most layer LB, disposed in an insulating layer 108. The contact array layer CA and via layers V1, V2, V3, Vn, and VLB provide functional electrical connection between the conductive line layers M1, M2, M3, M4, and Mn and the bond pad layer LB, in some locations (not all vias and conductive lines are shown within each layer), for example.

The insulating layers 122 in region 104 comprise low k insulating layers having a dielectric constant of less than about 3.9. The lower level insulating layer 120 in the CA layer may comprise a silicon oxide-based material such as a high density plasma (HDP) oxide or other insulating materials, to provide a strong base for the low k insulating layers 122 in region 104. The upper insulating layers 124 in region 106 may comprise silicon dioxide, for example, which is a structurally stronger material. The lower conductive layers in region 104 comprise conductive lines 112 and support vias 110 that are smaller and more closely spaced (not shown in the figure) than the conductive lines 112 and vias (not shown) in the upper conductive lines 106, for example. The lower conductive material layers in region 104 may include thin cap layers (not shown in FIG. 1) disposed over each low k insulating layer 122, to prevent diffusion of copper from conductive lines 112 and support vias 110 into the insulating layer 122, for example. The conductive lines 112 and vias in the upper layers 106 may also comprise thicker material layers (also not shown in FIG. 1) with relaxed ground rules, for example.

Because the insulating layers 122 in conductive material layers, M1, V1, M2, V2, M3 in region 104 that comprise low k materials require more structural support beneath a bond pad 114, support structures referred to in the art as copper line and via support (CLVS) structures are typically formed in conductive line and via layers M1, V1, M2, V2, and M3 (e.g., in region 104) of prior art semiconductor devices, e.g., where the insulating material 122 between the conductive lines and vias comprises a low k insulating material.

A prior art CLVS structure for bond pads will next be described. Like numerals are used for the elements in FIG. 2 as were used in the previous figure.

Figure 2:
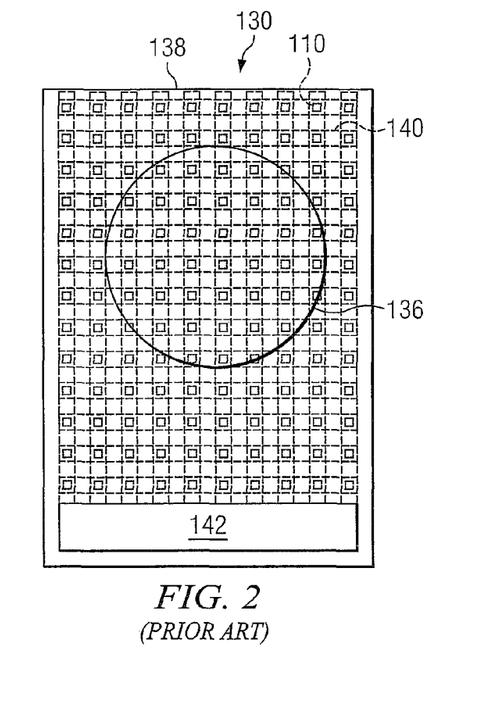
FIG. 2 shows a top view of a prior art copper line and via support (CLVS) structure formed in low k insulating material layers, wherein the CLVS structure has alternating metal fingers beneath the bond pad, preventing the use of the region beneath the bond pad for wiring.

FIG. 2 shows a top view of a wire bond region 130 of a semiconductor device such as the one shown in FIG. 1 having a multi-level interconnect, wherein a prior art CLVS structure comprises conductive support features 140 that comprise an array of alternating metal fingers disposed beneath the bond pad 138, preventing the use of the region beneath the bond pad 138 for wiring. Vias 110 are disposed between the conductive support features 140 that are arranged in a mesh or grid-like pattern, alternating by 90 degrees in every other conductive line layer having a low k insulating material (such as layers M1, M2, and M3 in region 104 of FIG. 1). The circular region 136 represents a wire bond that is adhered or wire bonded to the wire bond pad 138. Region 142 comprises a region of stacked metal levels where connection for that particular bond pad 138 is made to underlying conductive line and via levels, for example. Because the conductive support features 140 of the CLVS structure are formed beneath the entire wire bond pad 138, the region beneath the entire wire bond pad 138 cannot be used for functional wiring, resulting in an inefficient use of space on the semiconductor device.

Another problem with the prior art CLVS structure 140 shown in FIG. 2 is that the support structure 140 is only formed in low k insulating material layers, e.g., in insulating layers 122 in region 104 having a dielectric constant k of less than about 3.9. The support structure 140 is not formed in insulating layers 120 and 124 (see the CA layer and region 104, respectively, of FIG. 1) having a higher mechanical strength. The support structure 140 may include many vias 110 to increase the mechanical stability of the low k insulating material layers 122, for example. However, because only the low k insulating layers 122 are stabilized with support structure 140, and because there is no connection to the insulating layers 120 or 124, or to the workpiece 102, differences in the coefficients of thermal expansion (CTE) of the insulating layers 120,122, and 124 can lead to shear forces between the different material layers, which can result in delamination. Tear-outs have been observed after wire bond pull tests, which show a weakness in these semiconductor device structures.

Embodiments of the present invention provide several novel structures for improved support under bond pads of semiconductor devices. In some embodiments, support members are formed in an annular shape beneath a wire bond proximate the perimeter of the wire bond. In other embodiments, support structures are formed in non-low-k insulating material layers, in addition to supports being formed in low k insulating material layers, in various configurations of support structures. These various embodiments will be described further herein.

Figure 3A:
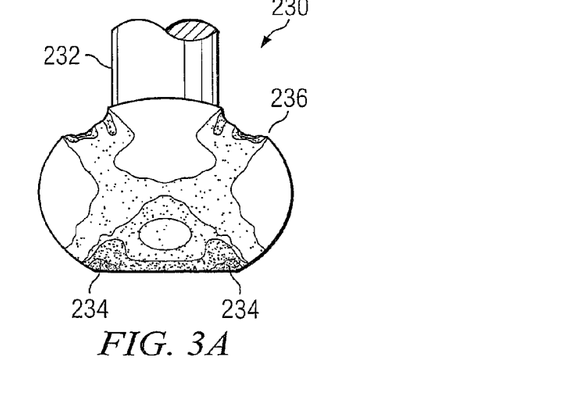
FIGS. 3A through 3C show stress simulation results of a wire bond at three different bonding forces, revealing that the area of maximum stress of the wire bond resides in regions proximate the perimeter of the wire bond.
Figure 3B:
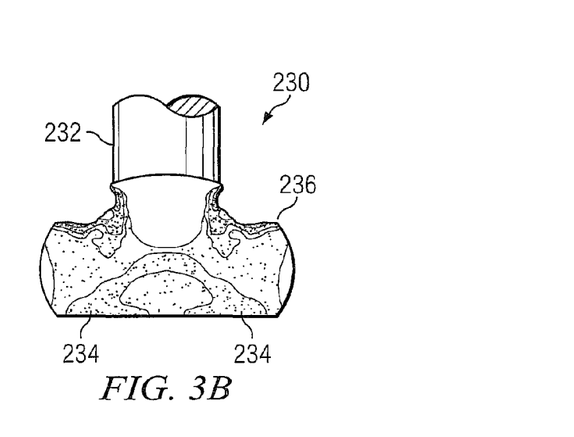
Figure 3C:
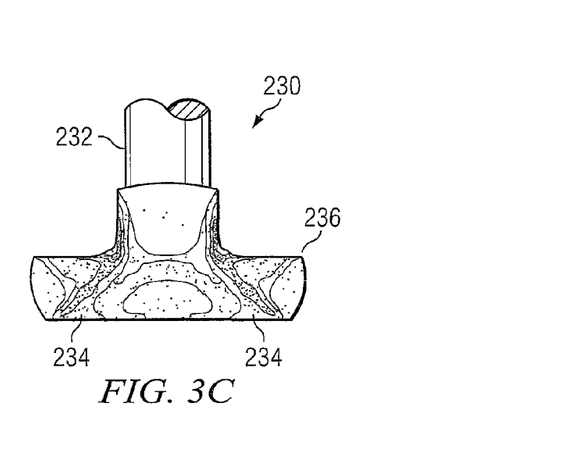

In embodiments of the present invention where a substantially annular support structure is used, technical advantages are achieved by placing support structures beneath wire bond pad regions of a semiconductor device in the locations where the support is most needed. FIGS. 3A through 3C show stress simulation results of a wire bond region 230 at three different bonding forces; low, medium, and high, respectively. Like numerals are used in FIGS. 3A through 3C as were used in the previous figures.

The wire bond region 230 includes a wire 232 that is bonded to a wire bond pad (e.g., such as a bond pad 138 in FIG. 2, or a bond pad 114 of FIG. 1). The wire 232 may comprise a thickness of about 20 to 25 μm or less, and may comprise about 18 μm, as examples. The wire bond 236 may comprise a diameter of about 40 to 50 μm or less at the bottom surface, and may comprise about 35 μm, as examples. Alternatively, the wire 232 and wire bond 236 may comprise other dimensions.

The wire bond 236 substantially comprises the shape of a ball or sphere that is flattened as force is used to bond the wire 232 to the bond pad. FIG. 3A shows the stress points within a wire bond 236 at a low bonding force, e.g., of about 30 g, as an example, indicating that an area of maximum stress 234 is located at the perimeter of the wire bond 236, e.g., in an annular or ring shape. FIG. 3B shows the stress points of the wire bond 236 at a medium bonding force, e.g., of about 60 g. FIG. 3C shows the stress points of the wire bond 236 at a high bonding force, e.g., of 90 g. These low, medium, and high bonding forces are used as examples; however, the bonding forces may comprise other values.

Note that as the wire bonding force is increased, the height of the wire bond 236 is decreased, and the diameter of the wire bond 236 is increased. The stress simulation results show that stress is not evenly distributed within a wire bond 236; rather, the highest amount of stress was found to be at the edge of the wire bond 236, e.g., at the perimeter of the substantially circular structure of the wire bond 236. Therefore, when a wire 232 is bonded to a bond pad of a semiconductor device, the maximum stress 234 locations of the wire bond 236 proximate the bond pad comprise an annular or ring shape, as shown.

In some embodiments of the present invention, novel structure supports for bond pads of semiconductor devices are disclosed, wherein the support structures are disposed beneath bond pads in an annular or ring shape in locations where wire bonds will be placed. Embodiments of the present invention will be described with respect to preferred embodiments in a specific context, namely semiconductor devices having multiple layers of interconnect. Embodiments of the invention may also be applied, however, to semiconductor devices having a single layer of interconnect, for example. Other embodiments of the invention do not comprise ring-shaped support structures, but comprise support members disposed in insulating material layers other than and/or in addition to support members being formed in low k insulating layers, providing increased mechanical stability for the bond pad region, for example.

Figure 4:
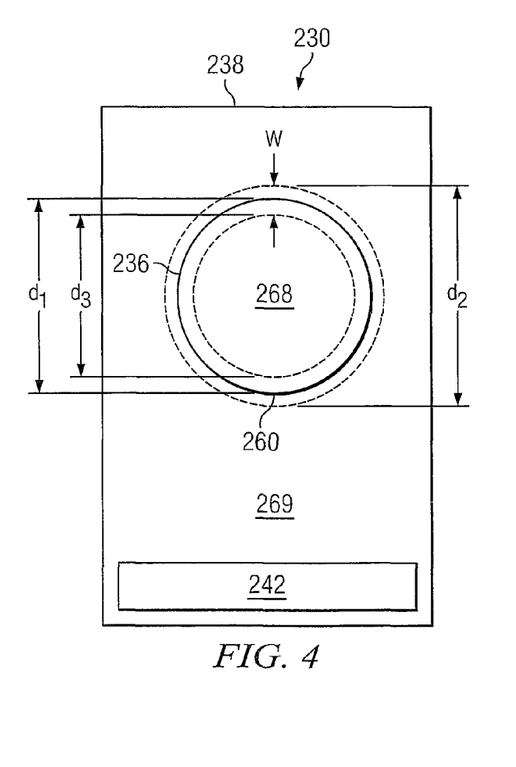
FIG. 4 shows a top view of a bond pad in accordance with an embodiment of the present invention, wherein a plurality of support members are disposed in an annular shape beneath and proximate the perimeter of a wire bond.

With reference next to FIG. 4, a top view of a wire bond region 230 of a semiconductor device is shown, illustrating the location of the novel support structures of some embodiments of the present invention in relation to a bond pad 238. Like numerals are used in FIG. 4 as were used in the previous figures. The bond pad 238 is disposed in an upper material layer of a semiconductor device (such as the semiconductor device 100 shown in FIG. 1), and the bond pad 238 may comprise aluminum, copper, combinations thereof, or other metals. The bond pad 238 may comprise, for example, Ni or Au disposed on top of aluminum. The region 242 located to the side of the wire bond 236 comprises an area where the lower metallization layers and conductive line layers are coupled to active areas of the semiconductor device, to make electrical contact to the bond pad 238, for example.

The support structures are formed in an annular shape where the wire bond 236 will be bonded to the bond pad 238. For example, the support structures of some embodiments of the present invention are preferably formed in an annular region 260 to support the maximum stress region, e.g., the perimeter region 234 of a wire bond 236 shown in FIGS. 3A, 3B, and 3C. The annular region 260 dimension may be designed according to the dimensions of the wire bond 236, the strength of the various underlying material layers, and the amount of space needed beneath and/or proximate the wire bond 236 for functional wiring, as examples, although other factors may also be considered.

For purposes of discussion, several diameters with respect to a wire bond 236 and an annular region 260 for the formation of the novel support structures for bond regions of semiconductor devices in accordance with embodiments of the present invention will next be described. The annular region 260 comprises a first diameter $d_1$, which may correspond to the maximum width expected for a wire bond 236 after the bonding process.

A second diameter $d_2$ is larger than the first diameter $d_1$ of the annular region 260 by a predetermined amount, to accommodate for variations in the wire bond diameter and other manufacturing process variations. The second diameter $d_2$ is the outer range for the positioning of the novel support structures, to be described further herein. The second diameter $d_2$ comprises the outer diameter of the annular region 260, for example.

A third diameter $d_3$ is smaller than the first diameter $d_1$ of the annular region 260 by the predetermined amount, also to accommodate for variations in the wire bond diameter and other manufacturing processes. The third diameter $d_3$ is the inner range for the positioning of the novel support structures. The third diameter $d_3$ comprises the inner diameter of the annular region 260, for example.

The predetermined amount may comprise about 1 μm or greater, for example, although the predetermined amount may comprise other dimensions. The predetermined amount may alternatively comprise a percentage of the first diameter $d_1$, for example, such as about 10%, although other percentages may also be used.

The annular region 260 may comprise a ring having a width W that may be calculated based on the first diameter $d_1$ and the predetermined amount, for example, although other methods may be used to determine the width W. The expected dimension of the wire bond 236 or first diameter $d_1$ is preferably located approximately at a center of the annular region 260, for example. The width W of the annular region 260 may comprise about 5 to 10 μm or less, for example, although the width W may comprise other dimensions.

As an example, if a wire bond 236 is expected to have a diameter of about 50 μm, the predetermined amount used to calculate the width W may comprise about +/− about 10% of the first diameter $d_1$, then the width W may be calculated using Eq. 1:

$$W = 2 \times 5 \mu m = 10 \mu m. \qquad \text{Eq. 1:}$$

Thus, in this example, the annular region 260 would extend from a diameter $d_3$ of about 45 μm to a diameter $d_2$ of about 55 μm.

As another example, the predetermined amount may comprise a fixed dimension, rather than a percentage. If the predetermined amount comprises 2 μm, and if a wire bond 236 is expected to have a diameter of about 40 μm, the width W may be calculated as shown in Equation 2:

$$W = 2 \times 2 \mu m = 4 \mu m; \qquad \text{Eq. 2:}$$

and the annular region 260 would extend from a third diameter $d_3$ of about 38 μm to a second diameter $d_2$ of about 42 μm. Alternatively, the width W may comprise other dimensions, depending on the expected ball size of the wire bond 236 after the wire bonding process and/or the predetermined amount (or percentage) used to calculate the width W, as examples.

The annular region 260 preferably comprises a width W that is large enough to account for potential variation in wire bond 236 ball placement and wire bond 236 size, e.g., from variations in the bonding force used and other processing parameter variations, such as the tolerances of the lithography masks, tools, and wire bonder, as examples. Preferably, support structures are not formed in a central region 268 of the wire bond region 230, e.g., in the middle of the wire bond 236, so that functional wiring may be routed in the central region 268. Advantageously, functional wiring may also be routed in a region 269 outside the annular region 260.

Figure 5:
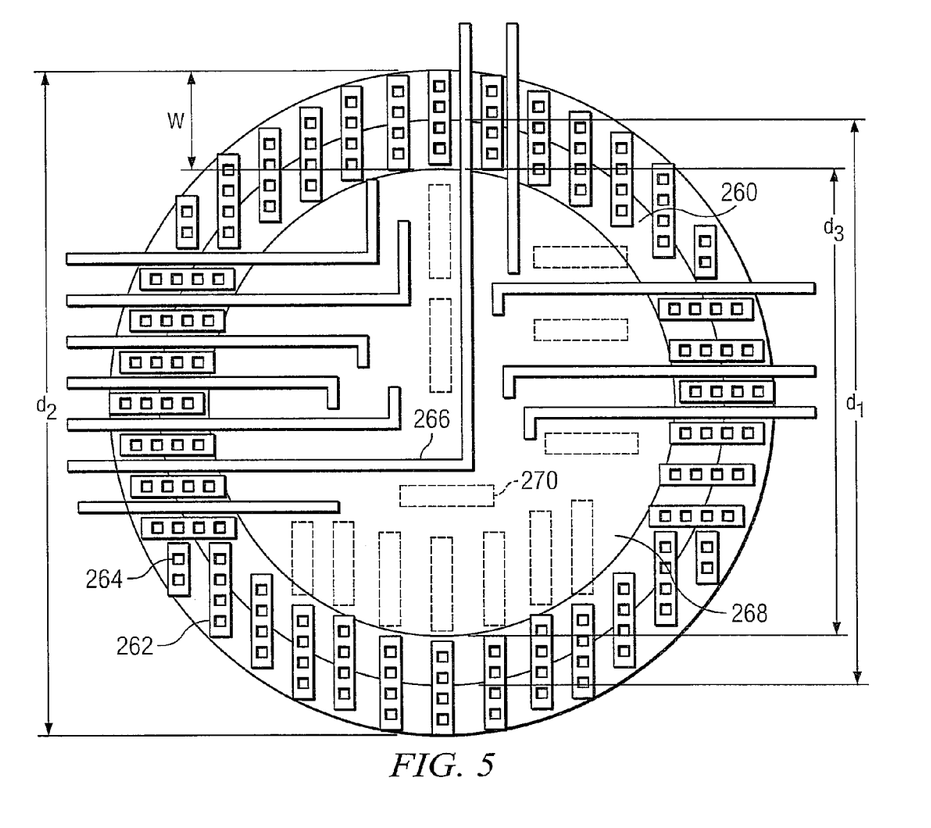
FIG. 5 shows a more detailed view of the support structure shown in FIG. 6, wherein the support members comprise rectangular shapes, wherein conductive lines may be routed between the support members and in the central region.

FIG. 5 shows a more detailed top view of a wire bond region 230 in an area beneath a wire bond 236 in accordance with an embodiment of the present invention. FIG. 5 shows a more detailed view of the support structure shown in FIG. 4, wherein a plurality of the support members 262 comprises rectangular shapes. The support members 262 are formed in at least one conductive line layer of the semiconductor device, disposed beneath a bond pad (e.g., such as bond pad 238 shown in FIG. 4). Support vias 264 are disposed beneath the rectangular support members 262, e.g., formed in one or more via layers of the semiconductor device. The support structure comprises a plurality of the support members 262 disposed substantially in the shape of an annular ring 260, as shown. Preferably, the support members 262 extend from the third or inner diameter $d_3$ to the second or outer diameter $d_2$ of the annular region 260, for example, as shown.

In this embodiment, each rectangular support member 262 comprises a width of about 2 to 4 μm and a length of about 4 to 10 μm, as examples, although alternatively, the support members 262 may comprise other dimensions. The support members 262 may be separated from one another by a distance of about 5 to 10 μm, for example, although they may also be separated from one another by other distances, particularly if conductive lines 266 are disposed between them, because the conductive lines 266 provide mechanical strength and support. For example, in some areas of the annular region 260, the support members 262 may be spaced apart by a distance so that a conductive line 266 may be routed between two adjacent support members 262, e.g., to extend into and/or through the central region 268. The conductive lines 266 may comprise a width of about 2 μm or less, and may alternatively comprise about 0.2 or 0.1 m or less, for example. The conductive lines 266 may comprise a minimum ground rule or smallest dimension of the semiconductor device, for example. The support members 262 are preferably separated from adjacent support members 262 by about 0.5 to 2 μm, and more preferably, by about 2 μm or less, in this embodiment, to accommodate for the width of the conductive lines 266, for example.

One or more of the conductive line layers beneath the bond pad region comprising the support members 262 may be formed using a damascene process. A damascene process is one in which an insulating material layer is deposited and patterned, and then filled with a conductive material to form conductive lines (e.g., in a single damascene process), or conductive lines and vias, in a dual damascene process. Excess conductive material is then removed from over the top surface of the insulating material layer using a chemical mechanical polish (CMP) process.

One concern during CMP processes is the even removal of conductive material, and the avoidance of dishing or excess removal of the insulating material layers, in order to maintain planarity in the various material layers. To improve the CMP process and results, in accordance with some embodiments of the present invention, dummy support structures 270 may be formed in the conductive material layers that the support members 262 are formed in, as shown in phantom in FIG. 5, for example. Likewise, dummy vias (not shown in the drawing) for each dummy support member may also be formed in the same via levels that the support vias 264 are formed in. The dummy support members 270 may comprise a similar shape as the support members 262, or alternatively, the dummy support members 270 may comprise other shapes, for example. The dummy support members 270 also improve the lithography processes for the material layers they are formed in, for example.

The novel support structure comprising a substantially annular shape is preferably formed in at least one first material layer beneath the at least one bond pad. The support structure comprises a plurality of support members, wherein the plurality of support members of the support structure comprises a first substantially annular shape beneath the at least one wire bond pad. The support structure may be formed in every conductive line layer and material layer over a workpiece, or may be formed in several, or in only one conductive line layer and/or via layer, for example. The support structure may be formed in metallization layers, semiconductive material layers, or both, for example.

Figure 6:
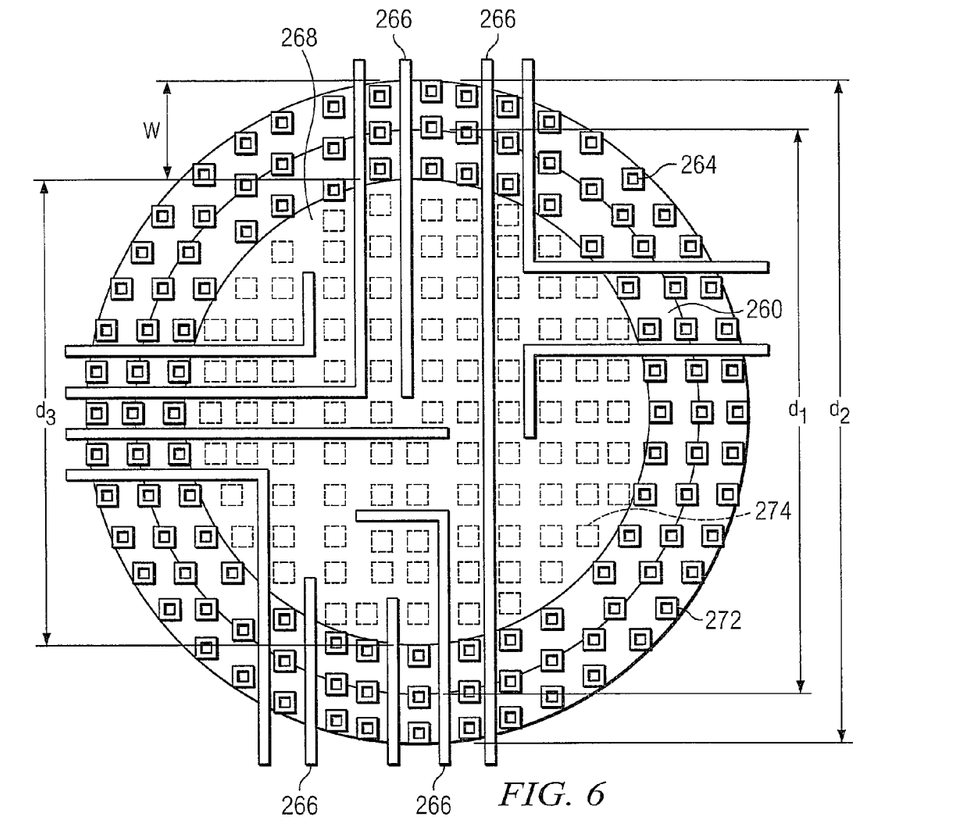
FIG. 6 shows another embodiment of the present invention, wherein the support members comprise square shapes.

FIG. 6 shows another embodiment of the present invention, wherein the support members 272 comprise a square shape. Again, support vias 264 are preferably disposed beneath the support members 272. Dummy support members 274 may optionally be formed in the central region 268, as shown, and conductive lines 266 may be routed between the support members 272, dummy support members 274, and into the central region 268 inside the annular region 260 of support structures. The square support members 272 may comprise about 2 to 4 μm square structures, e.g., in the low k insulating material layers 222, or they may comprise about 4 to 8 μm square structures, e.g., in upper insulating material layers 224, which are typically thicker, as examples, although alternatively, the support members 272 may comprise other dimensions.

Figure 8:
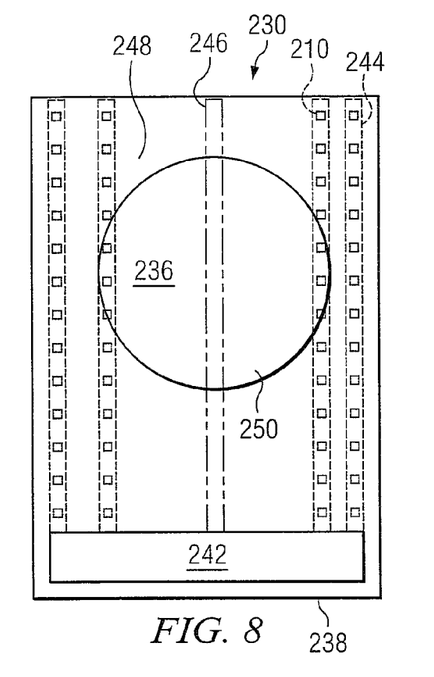
FIG. 8 shows a semiconductor device bond pad region with a plurality of support structures formed in insulating material layers in accordance with an embodiment of the present invention, wherein side supports are used as mechanical support for the bond pad region.

The support vias 264 may comprise one or more vias. For example, an array of a plurality of support vias 264 may be disposed beneath the support members 262 or 272. The support vias 264 preferably comprise the size of other vias formed on a semiconductor device. For example, the support vias 264 may comprise about 100 nm×100 nm wide structures, e.g., in the lower low k insulating material layers 222, as shown in FIG. 8, or the support vias 264 may comprise about 200×200 nm wide structures, e.g., in upper insulating material layers 224, which are typically thicker material layers than the lower insulating material layers 222, as examples, although alternatively, the support vias 264 may comprise other dimensions.

Figure 7:
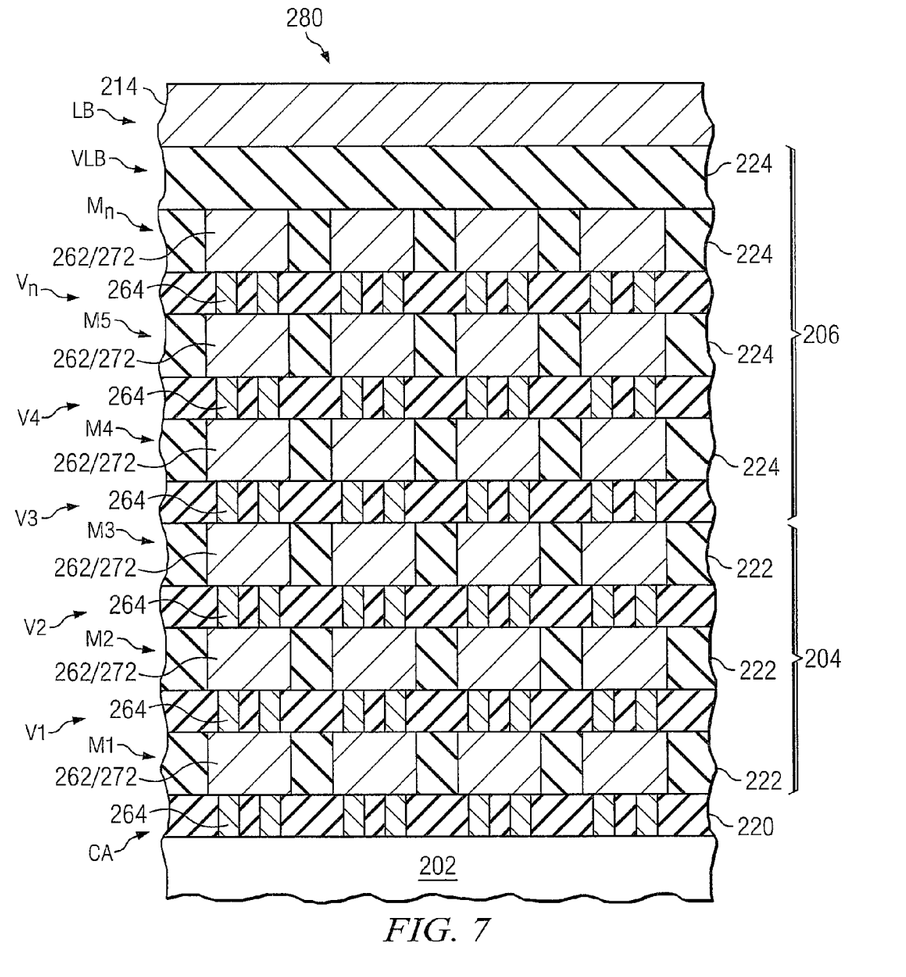
FIG. 7 shows a cross-sectional view of a preferred embodiment of the present invention, wherein the support members are formed in one or more insulating material layers disposed beneath a bond pad.

FIG. 7 shows a cross-sectional view of a preferred embodiment of the present invention, wherein the support members 262 or 272 and support vias 264 are formed in one or more conductive material layers disposed beneath a bond pad 214. A cross-sectional view of the annular region 260 is shown in FIG. 7; in other areas of the semiconductor device 280, e.g., in the central region 268 or areas outside the annular region 260, conductive lines and/or dummy support members (not shown in FIG. 7; see FIGS. 5 and 6) may be formed, for example. The support members 262/272 and support vias 264 may comprise metal, such as copper, aluminum, alloys thereof, or other metals or combinations thereof, formed in the BEOL. Alternatively, the support members 262/272 and support vias 264 may comprise a semiconductive material, such as polysilicon, e.g., in lower material layers, e.g., formed in the FEOL. The support members 262/272 and support vias 264 may be formed by single damascene processes, dual damascene processes, subtractive etch processes, or combinations thereof, for example.

Advantageously, in accordance with embodiments of the present invention, support members 262/272 and support vias 264 are formed beneath a bond pad 214 in an annular region 260 where the highest amount of stress will be placed on a wire bond (e.g., wire bonds 236 shown in FIGS. 3A, 3B, and 3C). Thus, the novel support structures described herein provide mechanical and structural support for the bond pad 214 where the support is most needed. Other conductive line areas beneath the bond pad 214 may be used for other purposes, such as for forming conductive lines and vias, and/or for forming dummy conductive lines and vias, to improve other processing steps, such as CMP and lithography, as examples.

Embodiments of the present invention also include methods of manufacturing a semiconductor device 280 comprising the support structures 262/272 and 264 described herein. No additional lithography masks are required to form the novel support structures 262/272 and 264; advantageously, they may be implemented in existing lithography mask levels. As an example of a process flow for forming the support structures, first, a workpiece 202 is provided, as shown in FIG. 7. The workpiece 202 may include a semiconductor substrate comprising silicon or other semiconductor materials that may be covered by an insulating layer, for example. The workpiece 202 may include active components or circuits formed in the FEOL, not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. The workpiece 202 may also comprise a silicon-on-insulator (SOI) substrate, for example.

An insulating layer 220 comprising a contact array (CA) level may be disposed or formed over the workpiece 202, as shown. The insulating layer 220 may comprise a silicon-oxide based insulator such as HDP oxide or other insulating material, and may comprise a plurality of support vias 264 formed therein. In some embodiments, the insulating layer 220 preferably does not comprise a low k insulating material, for example. The support vias 264 may comprise a metal or a semiconductor, for example. The support vias 264 may be formed in a damascene or subtractive etch process, for example. Functional vias, not shown, may be formed within the same insulating layer 220 that the support vias 264 are formed in, elsewhere on the semiconductor device 100.

A plurality of insulating layers 222 are sequentially formed over the insulating layer 220 and support vias 264, and alternating layers of support members 262 or 272 and support vias 264 are formed in the insulating layers 222. In one embodiment, the insulating layers 222 may comprise a low k dielectric material, or each layer may comprise a combination or multi-layers of silicon dioxide, silicon nitride, or other materials and a low k dielectric material, in region 204, as examples. For example, the insulating layers 222 may comprise about 300 nm or less of $SiO_2$, SiN, carbon-doped oxides, organic dielectric materials, or low-k insulating materials, or combinations thereof. The insulating layers 222 may comprise low k insulating materials such as Black Diamond™ from Applied Materials, SiCOH, Coral™ from Novellus Systems Inc., Aurora™ from ASM International, or other low k materials, as examples. The support members 262/272 and support vias 264 in two adjacent insulating layers 222 may be formed in a dual damascene process, for example, although single damascene processes and subtractive etch processes may also be used. Functional vias and functional conductive lines, not shown, may be formed within the same insulating layers 222 that the support vias 264 and support members 262/272 are formed in, elsewhere on the semiconductor device 100. The insulating layers 222 in region 204 are also referred to as M1, V1, M2, V2, and M3 layers, as shown. The insulating layers 222 may include cap layers (not shown) disposed over the low k insulating material, to prevent the conductive material such as copper from diffusing into the low k insulating material, for example.

A plurality of insulating layers 224 in region 206 is formed over the insulating layers 222 in region 204. Support members 262/272 and support vias 264 are preferably formed in alternating insulating layers 222, as shown, in V3, M4, V4, M5, Vn, and Mn layers disposed sequentially over the M3 layer of region 204, as shown. The plurality of insulating layers 224 in region 206 preferably does not comprise low k insulating materials, in some embodiments. For example, the insulating layers 224 may comprise $SiO_2$, fluorinated spin on glass (FSG), fluorinated tetra ethyl oxysilane (TEOS), n-BLOk™ from Applied Materials, or hybrids or multiple layers thereof, as examples, although other materials may also be used. The V3, M4, V4, M5, Vn, Mn, and VLB layers are typically thicker and may include or comprise a hard mask for increased mechanical stability, than the M1, V1, M2, V2, and M3 layers, for example. The V3, M4, V4, M5, Vn, Mn, and VLB layers may comprise a thickness of about 500 nm or more, for example. Support vias 264 are typically not formed within insulating layer 224 of layer VLB, to avoid interfering with the electrical wiring of the semiconductor device 280, e.g., with the wiring of the bond pad 214 to an underlying conductive line. Functional conductive lines and vias, not shown, may be formed within the same insulating layers 224 that the support vias 264 and support members 262/272 are formed in, elsewhere on the semiconductor device 280.

Note that the insulating material layers 220, 222, and 224 may include optional capping layers and/or liners comprised of various materials, such as nitrides or oxides, as examples, not shown.

The support members 262/272 and support vias 264 preferably comprise the same material used for the conductive line or conductive via layer they are formed in. The support members 262/272 and support vias 264 preferably comprise copper or a copper alloy in one embodiment, although alternatively, the support members 262/272 and support vias 264 may comprise other conductive materials, such as aluminum or aluminum alloys, as examples. A barrier layer and/or liner may be deposited over the insulating layers 220, 222, and 224 before depositing conductive material to form the support members 262/272 and support vias 264, for example, not shown.

Again, the support members 262 or 272 and support vias 264 may be formed in one or more conductive layers of a semiconductor device 100. In a preferred embodiment, the support members 262 or 272 and support vias 264 are formed in every conductive line layer disposed beneath a bond pad, in an annular shape disposed beneath the region where a wire bond will be formed, proximate the perimeter of the wire bond. The support members 262 and 272 may also be formed in a contact level, (e.g., CA layer) for example.

Processing of the semiconductor device 280 is then continued. For example, integrated circuits on a workpiece 202 are singulated to form individual die, and then wire bonds are attached to the bond pads 214 using a wire bonding process, to package the individual die or couple the die to other individual die in a multi-chip module, for example.

Embodiments of the present invention also include methods of designing semiconductor devices 280. The design methods include designing a semiconductor device 280 active region, e.g., within a workpiece 202 as shown in FIG. 7, and determining a bond pad 214 layout for the semiconductor device 280. A first diameter $d_1$ for a wire bond (e.g., such as wire bond 236 shown in FIGS. 3A, 3B, and 3C) that will be bonded to each bond pad 214 is determined. A layout for at least one conductive line layer (e.g., one or more of layers M1, M2, M3, M4, M5, Mn) is determined for the semiconductor device 280 to be located between the active region 202 and the bond pads 214, wherein the at least one conductive line layer layout includes a plurality of support members 262 or 272 arranged in a substantially annular shape proximate a perimeter of a wire bond region of each bond pad 214. The plurality of support members preferably comprises a diameter, wherein the diameter of the plurality of support members is substantially equal to the first diameter $d_1$ of the wire bond. A layout for at least one via layer (e.g., one or more of layers CA, V1, V2, V3, V4, or Vn) is designed to be adjacent the layout for the at least one conductive line layer, wherein the at least one via layer layout includes a plurality of support vias 264 proximate each of the plurality of support members 262/272.

In another embodiment, the at least one bond pad region of a semiconductor device comprises at least one bond pad and further comprises a wire bond coupled to the at least one bond pad. The wire bond comprises a perimeter, and the first support members and the plurality of second support members comprise a plurality of support members arranged in a substantially annular shape disposed beneath and proximate the perimeter of the wire bond.

In one embodiment, the support structures and support vias 264 may be formed in alternating rows and columns, e.g., forming alternating fingers of metal, as shown in FIG. 2. In this embodiment, the support structures are formed in the entire bond pad region, rather than being formed in an annular shape, as described for the embodiments shown in FIGS. 4, 5 and 6. For example, support structures may be formed in one metal layer M1 in rows running horizontally from left to right on the page, and support structures may be formed in an adjacent metal layer M2 in columns running vertically in and out of the page, with support vias 264 being disposed at intersections of the rows and columns, creating a multi-layer mesh support structure.

Preferably, in this embodiment, although the support structures and vias may comprise the shape of the prior art support structures and vias of the prior art FIG. 2, the support structures are formed not only in the low k insulating layers 222 as in the prior art, but the support structures and vias are also preferably formed in the insulating layer 220 disposed between the workpiece 202 and the low k insulating layers 222, which anchors the low k insulating layers 222 to the workpiece 202, preventing CTE mismatch delaminations. Alternatively, the support structures may also be formed in the insulating layers 224 in region 206 disposed between the low k insulating layers 222 in region 204 and the bond pad 214, providing increased structural support. In yet another embodiment, the interwoven mesh support structures may be formed both in insulating layer 220 and in insulating layers 224 in region 206, e.g., with support vias 264 being disposed between each insulating layer 220, 222, and 224, so that the support structures are formed in every insulating layer 220, 222, and 224 disposed between the workpiece 202 and the bond pad 214, other than the insulating layer for layer VLB immediately beneath the bond pad 214, for example.

Embodiments of the present invention also include support structures formed in non-low k insulating layers, wherein the support structures comprise other configurations. For example, support structures formed only at the sides, or at both the sides and a central strip of a bond pad region, as shown FIG. 8, may be formed in low k insulating layers 222 and also in insulating layer 220, insulating layers 224, or both insulating layer 220 and insulating layers 224. In another embodiment, discrete support structures, as shown in FIG. 9, may be formed in low k insulating layers 222 and also in insulating layer 220, insulating layers 224, or both insulating layer 220 and insulating layers 224.

For example, referring next to FIG. 8, another embodiment of the present invention is shown. A semiconductor device bond pad region 230 includes a support structure for the bond pad region 230. In this embodiment, conductive side support features 244 and vias 210 are formed in the metallization layers having both low k insulating material (such as layers M1, M2, and M3 in region 204 of FIG. 7) and also metallization layers having non-low k insulating material (such as layers M4, M5, and M, in region 206, or in CA layer) beneath the wire bond pad 238 at the sides of a wire bond 236, which allows for functional wiring to be routed beneath and proximate a portion 248 of the wire bond 236 and wire bond region 230. By forming the conductive side support features 244 and vias 210 in the metallization layers having non-low k insulating material, improved structural support is provided for the wire bond region 230, for example. Advantageously, functional wiring is possible in a direction parallel to the rows of the side supports 244 formed at the edges beneath the wire bond region 230, in this embodiment.

An alternative embodiment to the support structure shown in FIG. 8 that provides additional structural support is to include a central support member 246, shown in phantom in FIG. 8, that is placed parallel to and between the side support features 844, beneath the center of the wire bond 236. While the use of functional wiring is further limited by the use of the additional central support 246 beneath and proximate a portion 248 of the wire bond 236, this embodiment provides an increased amount of support for the wire bond region 230.

Figure 9:
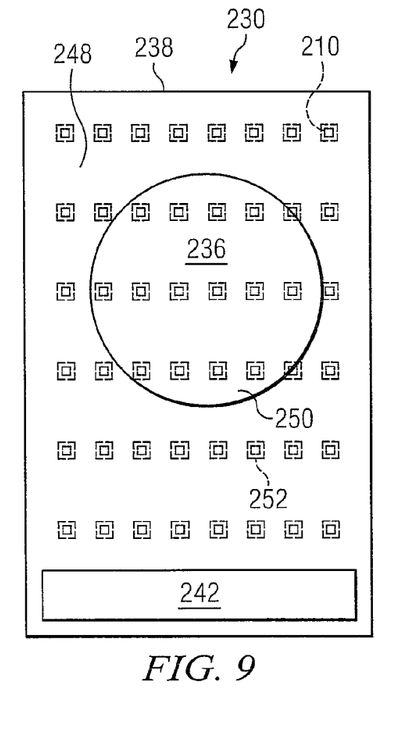
FIG. 9 shows another support structure in accordance with an embodiment of the present invention formed in insulating material layers and comprising a plurality of discrete support structures.

FIG. 9 shows another embodiment of the present invention, wherein a support structure for a wire bond region comprises a plurality of discrete support structures 252. The discrete support structures 252 comprise conductive regions and vias 210 formed in the metallization layers having low k insulating materials (such as layers M1, M2, and M3 in region 204 of FIG. 7) and also metallization layers having non-low k insulating material (such as layers M4, M5, and M, in region 206, or in CA layer), beneath the wire bond pad 238 at predetermined locations, e.g., disposed in an array beneath the wire bond 236. The discrete support structures 252 are preferably placed about 5 to 10 μm apart, for example, and are preferably evenly distributed beneath the bond pad 238, for example. This support structure also allows the placement of functional wiring in portions 248 of the area beneath and proximate the wire bond 136.

Note that the support structures shown in FIGS. 8 and 9 do not provide support in all perimeter areas of the wire bond 236, wherein the support is most needed. For this reason, the embodiments shown in FIGS. 8 and 9 comprise less-preferred embodiments of the present invention. For example, in FIG. 8, the two rows of supports 244 on a first side of the wire bond 236 and a second opposing side of the wire bond 236 do not provide support in the central region or at the sides of the wire bond 236 rotated 90 degrees from the rows of supports 244, e.g., at 250. However, because the support structures are preferably formed not only in the low k insulating layers 222, but also in either the insulating layer 220, the insulating layers 224, or both, the support structures in the low k insulating layers 222 are anchored to the workpiece 202 and/or to the overlying support structures, providing a much more mechanically strong structure throughout the various material layers. Mechanical stress may be dissipated through vias and support structures into the silicon of the workpiece 202, resulting in reduced stress in the low k insulating layers 222. The risk of tear outs during wire bond tests is therefore reduced.

There are several advantages of embodiments of the invention wherein the support members and the support vias beneath bond pads are formed in an annular shape beneath bond pads of a semiconductor device, proximate a perimeter of a wire bond that will be formed later in a wire bonding process. No additional lithography masks are required: the support structures are formed in conductive line and via layers of a semiconductor device. Areas that are not used for the support members and support vias (e.g. region 268 inside the annular region 260 and/or region 269 outside the annular region 260, as shown in FIG. 6) may be used for functional wiring and/or for dummy structures to improve CMP and lithography processes, allowing for semiconductor devices to be decreased in size, because the region 268 within the annular support members and the region 269 (see FIG. 4) outside the annular support members can be used for wiring. The reduction in size of semiconductor devices also results in a decreased cost. The largest amount of area possible is left unused under bond pads and/or active devices, resulting in the largest amount of area being made available for routing functional conductive lines. The risk of delamination of low k insulating material layers, and the risk of tear outs during wire bond tests, are both reduced. Increased stability of material layers beneath a wire bond pad results from the use of the novel embodiments of the present invention. The annular shaped support members may be formed in low k insulating material layers only, or also in other insulating material layers of a semiconductor device, such as upper metallization layers in region 206 not having a low k insulating material, and also in the contact array CA level, as shown in FIG. 7.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of designing a semiconductor device, the method comprising:
   designing a semiconductor device active region;
   determining a layout for a plurality of bond pads to be disposed over the semiconductor device active region;
   determining a first diameter for a perimeter of a wire bond that will be bonded to each of the plurality of bond pads; and
   designing a layout for at least one conductive line layer for the semiconductor device to be disposed between the active region and the plurality of bond pads, wherein the layout for the at least one conductive line layer includes a plurality of support members arranged in a substantially annular shape proximate the perimeter of the wire bond to be bonded to each bond pad, the annular shape of the plurality of support members comprising a second diameter, wherein the second diameter is substantially equal to the first diameter.

2. The method according to claim 1, further comprising designing at least one via layer layout to be disposed adjacent the layout for the at least one conductive line layer, wherein the layout for the at least one via layer includes a plurality of support vias proximate each of the plurality of support members.

3. The method according to claim 2, wherein designing the layout for the at least one via layer comprises designing functional vias, dummy support vias, or both, in the layout for the at least one via layer.

4. The method according to claim 1, wherein designing the layout for the at least one conductive line layer comprises designing functional conductive lines, dummy support members, or both, in the layout for the at least one conductive line layer.

5. The method according to claim 1, wherein the substantially annular shape of the plurality of support members comprises a ring having a width, wherein the width comprises about 5 to 10 µm or less.

6. The method according to claim 1, wherein the first diameter of the wire bond comprises about 40 to 50 µm or less.

7. The method according to claim 1, wherein the support members comprise a rectangular shape.

8. A method of manufacturing a semiconductor device, the method comprising:
   forming a plurality of insulating layers over a workpiece comprising active regions;
   forming a bond pad in a last insulating layer of the plurality of insulating layers; and
   bonding a wire bond to the bond pad, the wire bond having a diameter, wherein a first insulating layer, different than the last insulating layer, comprises a plurality of support members arranged in a substantially annular shape proximate the diameter.

9. The method according to claim 8, wherein a second insulating layer, different than the last insulating layer, comprises a plurality of support vias and wherein the support vias are arranged proximate to the support members.

10. The method according to claim 9, wherein the support vias are aligned under the support members.

11. The method according to claim 10, wherein the support vias and the support members comprise a same material and are formed in a dual damascene process.

12. The method according to claim 8, wherein the substantially annular shape of the plurality of support members comprises an inner diameter and an outer diameter and wherein dummy support members are arranged within the inner diameter of the first insulating layer.

13. The method according to claim 8, wherein the substantially annular shape of the plurality of support members comprises a ring having a width, wherein the width is about 5 to 10 μm or less.

14. The method according to claim 9, wherein the first insulating layer further comprises functional conductive lines and wherein the second insulating layer further comprises functional vias.

15. The method according to claim 8, wherein the first insulating layer is arranged under and in direct physical contact with the last insulating layer.

16. The method according to claim 9, wherein the second insulating layer is arranged under and in direct physical contact with the first insulating layer.

17. The method according to claim 8, wherein the plurality of insulating layers comprises vias and conductive lines in alternating layers.

18. A method of manufacturing a semiconductor device, the method comprising:
    forming a plurality of insulating layers over a workpiece comprising active regions;
    forming a first insulating layer comprising support vias over the plurality of insulating layers;
    forming a second insulating layer comprising support members over the first insulating layer, the support members arranged in a substantially annular shape having a first diameter and wherein the support vias are arranged under and in physical contact with the support members;
    forming a third insulating layer over the second insulating layer;
    forming a bond pad in the third insulating layer; and
    bonding a wire bond to the bond pad, the wire bond comprising a perimeter having a second diameter and wherein the first diameter and the second diameter are substantially the same.

19. The method according to claim 18, wherein the plurality of insulating layers comprises vias and conductive lines in alternating layers.

20. The method according to claim 18, wherein the first insulating layer further comprises functional conductive vias and dummy vias, and wherein the second insulating layer further comprises functional conductive lines and dummy support members.

* * * * *